United States Patent [19]

Konotsune et al.

[11] Patent Number: 5,112,694
[45] Date of Patent: May 12, 1992

[54] FLEXIBLE PRINTED-CIRCUIT BASE BOARD AND PROCESS FOR PRODUCING THE SAME

[75] Inventors: Shiro Konotsune, Yokosukashi; Hitoshi Yano, Ichiharashi; Souichiro Hiraki, Ichiharashi; Kazutsune Kikuta, Ichiharashi, all of Japan

[73] Assignee: Chisso Corporation, Japan

[21] Appl. No.: 556,408

[22] Filed: Jul. 24, 1990

[30] Foreign Application Priority Data

Jul. 31, 1989 [JP] Japan .................................. 1-199130

[51] Int. Cl.$^5$ .................................................. B32B 9/00
[52] U.S. Cl. ...................................... 428/457; 428/447; 428/901; 361/398; 528/26
[58] Field of Search ................ 528/26; 428/457, 901, 428/447; 361/398

[56] References Cited

U.S. PATENT DOCUMENTS 4,609,700  9/1986  Kuniz more et al. ............... 528/26
4,981,940  1/1991  Konotsone et al. ................. 528/26

Primary Examiner—Patrick J. Ryan
Assistant Examiner—Kam F. Lee
Attorney, Agent, or Firm—Leydig, Voit & Mayer

[57] ABSTRACT

A flexible double-sided copper-clad printed-circuit base board is provided with a core resin layer of a composite material essentially composed of a specific rigid-structured polyimide and a specific flexible-structured crosslinked polyimide silicone in a state of being inseparable from each other, wherein the core resin layer is formed directly between two copper foils. This base board is produced by coating a surface of a copper foil with a polyamic acid solution mixture of a specific polyamic acid and a specific polyamic acid - alkylsilane, heat-treating the resulting coated copper foil, and contact-bonding another copper foil to the resulting copper-foil/polyimide laminate.

2 Claims, No Drawings

FLEXIBLE PRINTED-CIRCUIT BASE BOARD AND PROCESS FOR PRODUCING THE SAME

BACKGROUND OF THE INVENTION

1. Field of the Invention

The present invention relates to a flexible printed-circuit base board of a copper-foil/polyimide-layer/copper-foil structure excellent in dimensional stability, heat resistance and electrical characteristics.

2. Prior Art

Conventional polyimide type flexible printed-circuit base boards with metallic foils on both sides thereof are predominantly of a structure comprising metallic foils laminated on both sides of a polyimide film with an adhesive therebetween.

Since such base boards are produced using an adhesive between a polyimide film and metallic foils, however, the characteristics of the base boards depend on the properties of the adhesive and hence involve poor heat resistance, poor chemical resistance, poor moisture resistance, poor flexibility, etc., which are all very problematic.

Proposed solutions to the foregoing problems include processes wherein two single-sided copper-clad base boards comprised of a polyimide layer and a copper foil were laminated on each other with an adhesive therebetween (see Japanese Patent Laid-Open Nos. 153,393/1980 and 18,294/1989). However, these processes also involve substantially the same problems as mentioned above because of the use of an adhesive.

Further proposed solutions to these problems include improved processes wherein a polyimide film is bonded directly to copper foils under heat and pressure conditions (see Japanese Patent Laid-Open No.181,857/1982 and Japanese Patent Publication No. 15,825/1986).

These improved processes require the same number of steps as or a larger number of steps than those of the processes previously proposed because of the additional step of producing a polyimide resin film, though base boards produced thereby are improved in heat resistance and electrical characteristics since no adhesive is used.

Furthermore, these improved processes involve a problem that conspicuous curling of a base board produced thereby occurs when part of a copper foil on one side thereof is removed by etching, because there is a large difference in thermal expansion coefficient between the copper foils and the polyimide resin film of the base board, which difference is attributed to the flexible chemical structure of the molecular chains of the polyimide designed with the aim of improving the adhesion of the polyimide film to the copper foils. If use is made of a polyimide resin having a thermal expansion coefficient substantially in agreement with that of copper foils, there arises a general problem that the adhesion of the polyimide resin to copper foils tends to be low.

As a result of intensive investigations with a view to solving these problems, the inventors of the present invention have found out that a flexible double-sided copper-clad printed-circuit base board of a copper-foil/polyimide-layer/copper-foil structure excellent in dimensional stability, heat resistance and electrical characteristics, which board is endowed with a very high adhesion between the copper foils and the polyimde layer thereof and does not undergo curling even when part of a copper foil on one side of the base board is removed by etching, can be obtained by applying a solution of polyamic acids as specified in the present invention on a surface of a copper foil, curing the resulting coating film through heating to form a copper-foil/polyimide laminate, and contact-bonding another copper foil to the polyimide surface of the laminate under heat and pressure conditions. The present invention has been completed based on this finding.

SUMMARY OF THE INVENTION

More specifically, in accordance with one aspect of the present invention, there is provided a flexible printed-circuit base board comprising two copper foils and a resin layer of a composite material (mixture) essentially composed of a polyimide having recurring units represented by the following general formula (I) and a polyimide-silicone represented by the following general formula (II), wherein the resin layer is formed directly between the two copper foils:

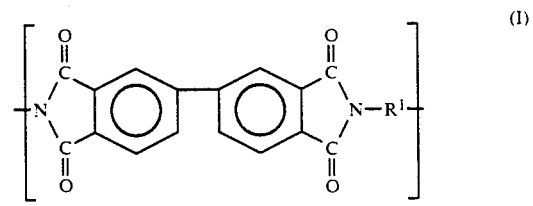

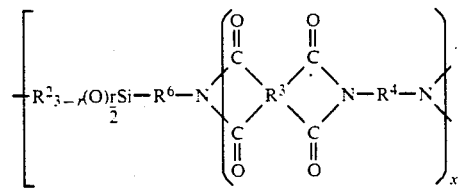

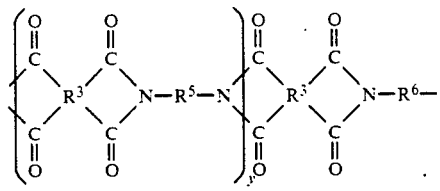

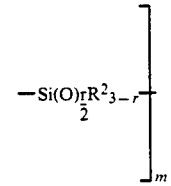

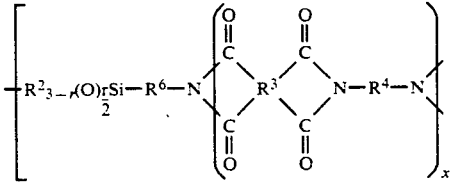

-continued

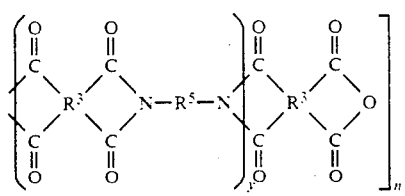
(II)

wherein $R^1$ stands for a bivalent aromatic hydrocarbon group represented by the formula:

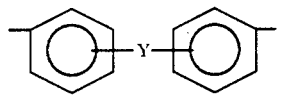

or

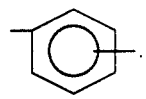

provided that both kinds of aromatic hydrocarbon groups of the above-mentioned formulae are contained in the polyimide with units of the formula (I); $R^2$ stands for a monovalent aliphatic hydrocarbon group having at most 5 carbon atoms or a monovalent aromatic hydrocarbon group having at most 9 carbon atoms; $R^3$ stands for a tetravalent aromatic hydrocarbon group; $R^4$ stands for a bivalent aromatic hydrocarbon group; $R^5$ stands for a siloxane chain; $R^6$ stands for a bivalent aliphatic hydrocarbon group having 3 to 5 carbon atoms or a bivalent aromatic hydrocarbon group having 6 to 9 carbon atoms; Y stands for —O—, —CO—, —SO$_2$—, or —CH$_2$—; r is 2 or 3; the molar ratio of x:y is in the range of 97-60:3-40; the molar ratio of m:n is in the range of 50-100:50-0.

In the flexible printed-circuit base board of the present invention as specified above, the groups $R^1$ contained in the polyimide with units of the formula (I) are preferably composed of 5 to 30 mol % of

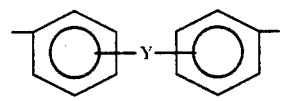

and 70 to 95 mol % of

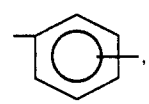

while $R^2$ in the formula (II) is preferably a methyl group or a phenyl group and $R^5$ in the formula (II) is preferably a siloxane chain represented by the following general formula (V):

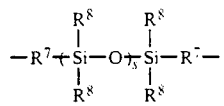
(V)

wherein $R^7$ stands for a bivalent aliphatic hydrocarbon group having 3 to 5 carbon atoms or a bivalent aromatic hydrocarbon group having 6 to 9 carbon atoms; $R^8$ stands for an aliphatic hydrocarbon group having 1 to 3 carbon atoms or an aromatic hydrocarbon group having 6 to 9 carbon atoms; Y is the same as defined above; and s stands for an integer of 3 to 150.

In accordance with another aspect of the present invention, there is provided a process for producing a flexible printed-circuit base board, comprising the step of coating a surface of a copper foil with a polyamic acid solution mixture of a solution of a polyamic acid having recurring units represented by the following general formula (III) and a solution of a polyamic acid—alkylsilane represented by the following general formula (IV), the step of heat-treating the resulting coated copper foil to form a copper-foil/polyimide laminate, and the step of contact-bonding another copper foil to the polyimide surface of the copper-foil/polyimide laminate under heat and pressure:

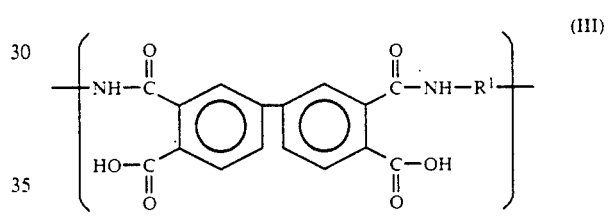
(III)

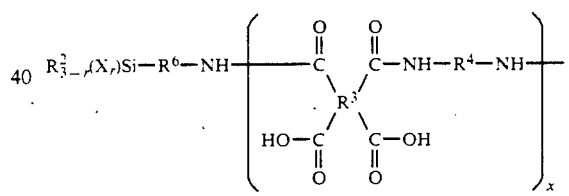

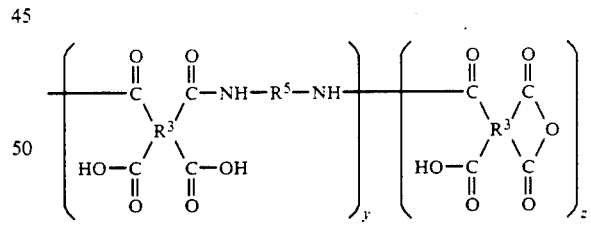

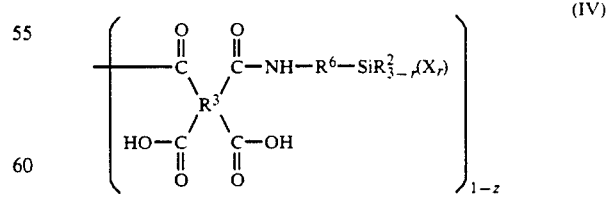
(IV)

wherein $R^1$, $R^2$, $R^3$, $R^4$, $R^5$, $R^6$, r, x, and y are the same as defined above; X stands for a hydrolyzable alkoxy or acetoxy group, or a hydrolyzable halogen atom; and z is a numerical value of 0 to 0.5.

In the process for producing a flexible printed-circuit base board according to the present invention, the groups $R^1$ contained in the polyamic acid with units of the formula (III) are preferably composed of 5 to 30 mol % of

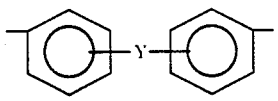

and 70 to 95 mol % of

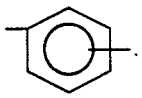

while $R^2$ in the formula (IV) is preferably a methyl group or a phenyl group and $R^5$ in the formula (IV) is preferably a siloxane chain represented by the following general formula (V):

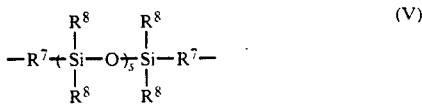

wherein $R^7$ stands for a bivalent aliphatic hydrocarbon group having 3 to 5 carbon atoms or a bivalent aromatic hydrocarbon group having 6 to 9 carbon atoms; $R^8$ stands for an aliphatic hydrocarbon group having 1 to 3 carbon atoms or an aromatic hydrocarbon group having 6 to 9 carbon atoms; Y is the same as defined above; and s stands for an integer of 3 to 150.

The groups or atoms $(X_r)$ in the group $R^2{}_{3-r}(X_r)Si$- in the formula (IV) are hydrolyzed through the process of the present invention to be converted into crosslinking $(O)r$ in the group $-R^2{}_{3-r}(O)_rSi$- in the formula (II). The monovalent group $R^2$, if any, in the formula (II) is bonded to a silicon atom Si in the group $-R_{3-r}{}^2(O)_rSi$-.

The polyamic acid of the formula (III) to be used in the process of the present invention is prepared by reacting 3,3',4,4'-biphenyltetracarboxylic dianhydride represented by the following formula (VI):

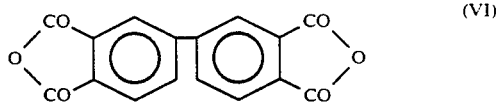

with a phenylendiamine represented by the following general formula (VII):

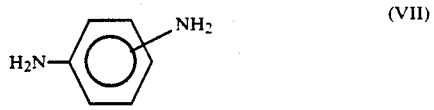

and an aromatic diamine represented by the following general formula (VIII):

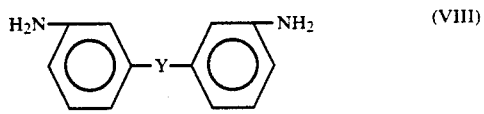

in a polar organic solvent.

As the phenylenediamine to be used in the foregoing reaction, there can be mentioned p-phenylenediamine, m-phenylenediamine, and o-phenylenediamine, which may be used either alone or in mixture. The use of p-phenylenediamine or a mixture of p-phenylenediamine and m-phenylenediamine is preferable in light of the purposes of the present invention.

Examples of the aromatic diamine of the formula (VIII) include 4,4'-diaminodiphenyl ether, 3,4'-diaminodiphenyl ether, 3,3'-diaminodiphenyl ether, 4,4'-diaminodiphenyl sulfone, 3,4'-diaminodiphenyl sulfone, 4,4'diaminodiphenyl ketone, 4,4'-diaminodiphenylmethane, which may be used either alone or in mixture. 4,4'-Diaminodiphenyl ether, 3,3'-diaminodiphenyl ether, 3,4'-diaminodiphenyl ether, and mixtures thereof are preferable in light of the purposes of the present invention.

The molar ratio of the diamine of the formula (VII): the diamine of the formula (VIII) is preferably in the range of 70–95:30–5.

The polyamic acid of the general formula (IV) in the form of the polyamic acid—alkylsilicone is prepared by reacting an aromatic tetracarboxylic dianhydride represented by the following general formula (IX) with an aromatic diamine represented by the following general formula (X), a α,ω-diaminosilicone represented by the following general formula (XI), and an aminoalkylsilane represented by the following general formula (XII) in an organic solvent.

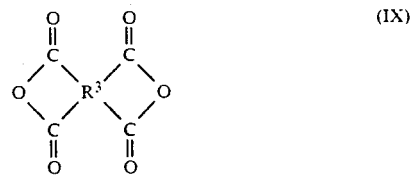

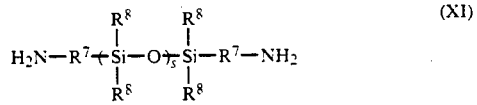

Representative examples of the aromatic tetracarboxylic dianhydride of the formula (IX) include pyromellitic dianhydride, 3,4,3',4'-biphenyltetracarboxylic dianhydride, 3,4,3',4'-benzophenonetetracarboxylic dianhydride, 2,3,3',4'-benzophenonetetracarboxylic dianhydride, bis(3,4-dicarboxyphenyl) ether dianhydride, and bis(3,4-dicarboxyphenyl) sulfone, which may be used either alone or in mixture.

Representative examples of the aromatic diamine of the formula (X) include p-phenylenediamine, m-phenylenediamine, 4,4'-diaminodiphenyl ether, 3,4'-diaminodiphenyl ether, 3,3'-diaminodiphenyl ether, 4,4'-diaminodiphenyl ketone, 3,4'-diaminodiphenyl ketone, 4,4'-diaminodiphenyl sulfone, 4,4'-diaminobiphenyl, 3,4'-diaminobiphenyl, 4,4'-diaminodiphenylmethane, 2,2'-bis(4-aminophenyl)propane, 1,4-di(4-aminophenyl) phenyl ether, and 1,3-di(4-aminophenyl) phenyl ether, which may be used either alone or in mixture.

Examples of the α,ω-diaminosilicone of the formula (XI) include those respectively represented by the following formulae, which may be used either alone or in mixture.

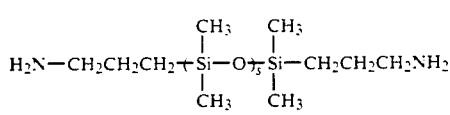

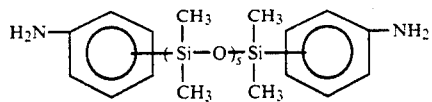

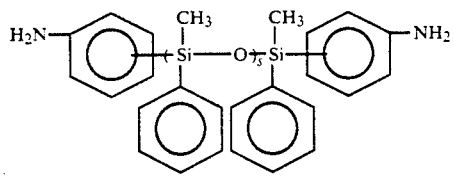

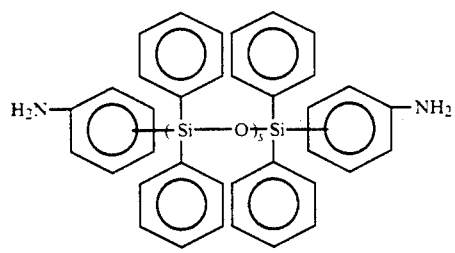

The amount of the α,ω-diaminosilicone(s) of the formula (XI) to be used is preferably 3 to 40 mol % based on the total amount of the diamines [sum of the molar amount of the aromatic diamene(s) of the formula (X) and the molar amount of the α,ω-diaminosilicone(s) of the formula (XI)].

Representative examples of the aminoalkylsilane of the formula (XII) include those respectively represented by the following formulae, which may be used either alone or in mixture.

H₂N—CH₂CH₂CH₂—Si(OCH₃)₃,

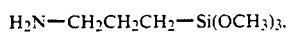, H₂N—CH₂CH₂CH₂—SiCl₃,

H₂N—CH₂CH₂CH₂CH₂CH₂—Si(OCH₃)₃,

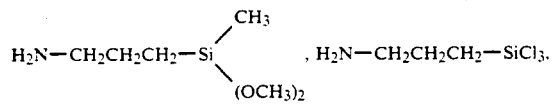,

H₂N—CH₂CH₂CH₂CH₂CH₂—SiCl₃,

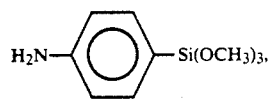 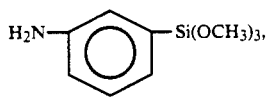

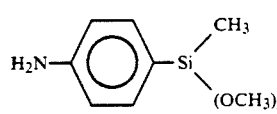 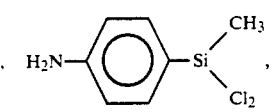

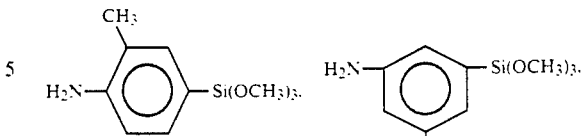

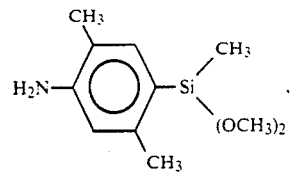

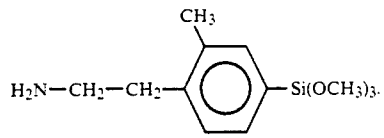

Among them, p-aminophenyltrimethoxysilane, m-aminophenyltrimethoxysilane, mixtures of p-aminophenyltrimethoxysilane and m-aminophenyltrimethoxysilane, and p-aminophenylmethyldimethoxysilane are preferable in light of the purposes of the present invention.

The amount of the aminoalkylsilane(s) to be used is 0.5 to 20 mol %, preferably 1 to 10 mol %, based on the total amount of the diamines.

As the organic solvent usable in the reactions for the syntheses of the polyamic acids of the formulae (III) and (IV), there can be mentioned polar organic solvents such as N-methyl-2-pyrrolidone, N,N-dimethylacetamide, N,N-dimethylformamide, dimethyl sulfoxide, cresole, ethyl carbitol, and cyclopentanone, which may be used either alone or in mixture. The above-mentioned organic solvents can also be used in mixture with xylene, toluene, ethylene glycol, monoethyl ether, a mixture thereof, or the like.

A description will now be made of the conditions of the syntheses. In the case of the synthesis of the polyamic acid (III), diamines are dissolved in a polar organic solvent to prepare a solution, to which the tetracarboxylic dianhydride in an amount equimolar with the diamines is then consecutively added with stirring in a stream of nitrogen. According to the foregoing procedure, the reaction may be carried out for 1 to 24 hours while keeping the temperature of the reaction system at 0° to 80° C. The molecular weight of the resulting polyamic acid is preferably such as to correspond to a logarithmic viscosity number of 0.7 to 2 as measured in N-methyl-2-pyrrolidone in a polyamic acid concentration of 0.5 g/100 ml at 30° C.

In the case of the synthesis of the polyamic acid of the formula (IV), a diamine(s) of the formula (X), a diamine(s) of the formula (XI), and an aminosilane(s) of the formula (XII) are dissolved in an organic solvent to prepare a solution, to which a predetermined amount of a tetracarboxylic dianhydride(s) of the formula (IX) is consecutively added with stirring in a stream of nitrogen. According to the foregoing procedure, the reaction may be carried out for 1 to 24 hours while keeping the temperature of the reaction system at 0° to 80° C.

Alternatively, a predetermined amount of the tetracarboxylic dianhydride(s) of the formula (IX) may be consecutively added to a solution of the diamines of the respective formulae (X) and (XI) dissolved in an organic solvent with stirring in a stream of nitrogen to effect a reaction, after the completion of which the aminoalkylsilane(s) of the formula (XII) is added to the reaction mixture to effect a reaction. The amounts of the components to be used in the foregoing reaction(s) preferably satisfy the following relationships:

$$1 \leq \frac{D}{A - (B + C)} \leq 2$$

$$0.001 \leq \frac{D}{2B + 2C + D} \leq 0.1$$

wherein A stands for the molar amount of the tetracarboxylic dianhydride of the formula (IX), B stands for the molar amount of the aromatic diamine of the formula (X), C stands for the molar amount of the $\alpha,\omega$-diaminosilicone of the formula (XI), and D stands for the molar amount of the aminoalkylsilane of the formula (XII).

The logarithmic viscosity number of the polyamic acid of the formula (IV) prepared through the foregoing reaction(s) is preferably in the range of 0.05 to 1 when measured in N-methyl-2-pyrrolidone in a polyamic acid concentration of 0.5 g/100 ml of at a temperature of 30° C.

The polyamic acid of the formula (III) prepared by the aforementioned reaction is mixed with the polyamic acid of the formula (IV) prepared by the foregoing reaction(s) at such a ratio as to satisfy the following formula:

$$0.02 \leq \frac{F}{E + F} \leq 0.50, \text{ preferably}$$

$$0.05 \leq \frac{F}{E + F} \leq 0.3$$

wherein E and F stand for the weights of the polyamic acids of the formulae (III) and (IV), respectively.

The reaction mixtures may be used as such in the foregoing mixing step to form a mixture of the polyamic acids, from which part of the reaction solvent may be removed if desired, or to which a solvent may further be added if desired. In the foregoing manner, a solution mixture of the polyamic acids is prepared. Subsequently, the solution mixture is applied on a copper foil according to a suitable coating method, examples of which include a comma-coat method and an extrusion casting method. However, the coating method is not particularly restricted.

The polyamic acids contained in the solution mixture are converted into polyimides when heat-treated after the foregoing application. The heat treatment is usually carried out in two stages, namely at 100° to 200° C. for 10 to 90 minutes and subsequently at 200° to 350° C. for 10 to 270 minutes.

The resulting flexible single-sided copper-clad base board is subjected to contact bonding to another copper foil under heat and pressure conditions to produce a flexible double-sided copper-clad base board (flexible double-sided printed-circuit base board) having a copper-foil/resin/copper-foil three-layer structure. The heating temperature may be in the range of 200° to 500° C. As the contact bonding method, there can be mentioned, for example, a roller press method and a plate press method.

The linear pressure in the case of the roller press method is set in the range of 5 to 100 kg/cm, while the areal pressure in the case of the plate press method is set in the range of 25 to 10,000 kg/cm.$^2$ When the linear or areal pressure is below the range as specified above, no sufficient adhesion is secured between the copper foils and the resin layer. When the linear or areal pressure is too high, elongation and/or deformation of the copper foils is liable to occur. The roller press method is preferable from the industrial viewpoint of easiness of degassing (deaeration) and productivity.

The flexible print-circuit base board of the present invention is highly valuable from a practical point of view in that it is not only excellent in adhesion between the polyimide layer and the copper foils thereof, but also undergoes no curling even when a copper foil on one side of the base board is removed, while perforation of the base board has little tendency to cause smears and avoids adhering to through-holes. This is attributable to the synergistic effect of the polyimide and the polyimide-silicone incorporated into a composite structure wherein the chains of the rigid-structured polyimide having a controlled linear expansion coefficient and the crosslinked chains of the flexible-structured crosslinked polyimide containing polysiloxane chains are inseparable from each other.

PREFERRED EMBODIMENTS OF THE INVENTION

The following Examples will now illustrate the present invention in more detail in comparison with the follwoing Comparative Examples, but should not be construed as limiting the scope of the present invention.

EXAMPLE 1

(1) Synthesis of Polyamic Acid (A)

A stirrer was set in a 500 ml three-necked flask, which was then purged with nitrogen. Thereafter, 250 ml of dimethylacetamide was poured into the flask, into which 8.6 g of p-phenylenediamine and 4.0 g of 4,4'-diaminodiphenyl ether was then placed to dissolve them in the dimethylacetamide. After completion of the dissolution operation, 29.4 g of 3,4,3',4'- biphenyltetracarboxylic dianhydride was so slowly added to the reaction system being stirred as to keep the reaction temperature from exceeding 10° C. to effect a reaction. After completion of the slow addition, the reaction was continued at a reaction temperature of 15° C. for 5 hours to prepare a solution of a polyamic acid. The logarithmic viscosity number of the resulting polyamic acid was 1.8 when measured in N-methyl-2-pyrrolidone in a polyamic acid concentration of 0.5 g/dl at 30° C.

(2) Synthesis of Polyamic Acid (B)

150 ml of purified dimethylacetamide was poured into a 300 ml three-necked flask, into which 3.5 g of p-phenylenediamine and 10.3 g of $\alpha,\omega$-di(3-aminopropyl) polydimethylsiloxane were then placed to dissolve them in the dimethylacetamide. After completion of the dissolution operation, 14.7 g of biphenyltetracarboxylic dianhydride was added to the reaction system, followed by addition thereto of 0.6 g of aminophenyltrimethoxysilane to effect a reaction. The reaction was carried out with stirring at 15° C. for 5 hours to obtain a polyamic acid having a logarithmic viscosity number of 0.3 as measured in N-methyl-2-pyrrolidone in a polyamic acid concentration of 0.5 g/dl at 30° C.

(3) Production of Single-Sided Base Board

The solution of the polyamic acid (A) prepared in the above step (1) was mixed with the solution of the polyamic acid (B) prepared in the above step (2) at a (A)/(B) weight ratio of 4/1 to prepare a homogeneous solution mixture of the polyamic acids (A) and (B), which was then applied in a wet thickness of about 100 μm on an electrolytic copper foil of 35 μm thickness by means of an applicator to form a coating film. The resulting coated copper foil was set in a frame and placed in an electric oven, in which it was then heated at 100° C. for 30 minutes, at 150° C. for 30 minutes, at 250° C. for 30 minutes, and at 350° C. for 1 hour to dry and cure the coating film. Thus, a single-sided base board was produced.

(4) Production of Double-Sided Base Board

The resin surface of the double-sided base board obtained in the above step (3) was superposed on a surface of an electrolytic copper foil of 35 μm in thickness, followed by contact bonding under heat and pressure by means of a hot roller press under a linear pressure of 40 kg/cm at a speed of 0.2 m/min. Thus, a double-sided base board was produced. The adhesion strength between the resin layer and the copper foils was 1.4 kg/cm in terms of peel strength at an angle of 180°. The copper foil on one side of the double-sided base board was removed by etching. No curling of the base board is recognized at all.

The composition and thickness of the resin layer of the base board in Example 1 are listed in Table 1, while the conditions of contact bonding and the results in Example 1 are listed in Table 2.

EXAMPLES 2 TO 5

The resin surface of the same single-sided base board as obtained in Example 1 was superposed on a surface of an electrolytic copper foil of 35 μm thickness, followed by contact bonding by means of a hot roller press in substantially the same manner as in Example 1 except for conditions of contact bonding as listed in Table 2.

In the foregoing manner, four double-sided base boards were produced.

The conditions of contact bonding and the results in Examples 2 to 5 are listed in Table 2.

EXAMPLE 6

(1) Synthesis of Polyamic Acid (A)

Substantially the same procedure of synthesis as in the step (1) of Example 1 was repeated except that the composition of the diamine components was varied as shown in Table 1.

(2) Synthesis of Polyamic Acid (B)

Substantially the same procedure of synthesis as in the step (2) of Example 1 was repeated except that the composition of the tetracarboxylic dianhydride components and the composition of the diamine components were varied as shown in Table 1.

(3) Production of Single-Sided Base Board

Substantially the same procedure as in the step (3) of Example 1 was repeated except that the mixing weight ratio of the polyamic acid (A) to the polyamic acid (B) was varied as shown in Table 1.

(4) Production of Double-Sided Base Board

The resin surface of the single-sided base board obtained in the above step (3) was superposed on a surface of an electrolytic copper foil of 35 μm thickness, followed by contact bonding by means of a hot roller press in substantially the same manner as in Example 1. Thus, a double-sided base board was produced.

The composition and thickness of the resin layer of the base board in Example 6 are listed in Table 1, while the conditions of contact bonding and the results are listed in Table 2.

EXAMPLES 7 AND 8

The resin surface of the same single-sided base board as obtained in the step (3) of Example 6 was superposed on a surface of an electrolytic copper foil of 35 μm in thickness, followed by contact bonding by means of a hot roller press in substantially the same manner as in Example 6 except for the conditions of contact bonding as shown in Table 2.

Thus, two double-sided base boards were produced.

The conditions of contact bonding and the results in Examples 7 and 8 are shown in Table 2.

COMPARATIVE EXAMPLES 1 TO 3

(1) Synthesis of Polyamic Acid (A)

Substantially the same procedure of synthesis as in the step (1) of Example 1 was repeated except for replacement of the kind of tetracarboxylic dianhydride component and/or diamine component as shown in Table 1 and replacement of the kind of solvent only in Comparative Example 1.

(2) Production of Single-Sided Base Board

Substantially the same procedure as in the step (3) of Example 1 was repeated except that no polyamic acid (B) was mixed with the polyamic acid (A).

(3) Production of Double-Sided Base Board

The resin surface of the single-sided base board was superposed on a surface of an electrolytic copper foil of 35 μm thickness, followed by contact bonding by means of a hot roller press in substantially the same manner as in the step (4) of Example 1 except that the conditions of contact bonding were differently set as shown in Table 2 in Comparative Examples 1 and 3.

Thus, three double-sided base boards were produced.

The compositions and thicknesses of the resin layers of the base boards in Comparative Examples 1 to 3 are listed in Table 1, while the conditions of contact bonding and the results in Comparative Examples 1 to 3 are listed in Table 2.

TABLE 1

| | Polyamic Acid Composition and Film Thickness | | | | | | | | |
|---|---|---|---|---|---|---|---|---|---|
| | Polyamic Acid (A) | | | Polyamic Acid (B) | | | | | |
| Ex. No. Comp. Ex. No. | Acid Anhydride Components (mol) | Diamine Components (mol) | Logarithmic Viscosity Number | Acid Anhydride Components (mol) | Diamine Components (mol) | Logarithmic Viscosity Number | Solvent | (A)/(B) Mixing Wt. Ratio | Film Thickness (mμ) |
| Ex. 1-5 | S-BPDA (0.1) | p-PDA (0.08) 4,4'-DDE (0.02) | 1.8 | S-BPDA (0.05) | p-PDA (0.032) APMS-6 (0.016) p-APS (0.003) | 0.3 | DMAC | 4/1 | 23 |
| Ex. 6-8 | S-BPDA (0.1) | p-PDA (0.06) m-PDA (0.01) 4,4'-DDE (0.03) | 1.6 | S-BPDA (0.04) BTDA (0.01) | p-PDA (0.03) m-PDA (0.012) APMS-18 (0.007) APSE (0.001) | 0.4 | DMAC | 7/1 | 26 |
| Comp. Ex. 1 | PMDA (0.1) | 4,4'-DDE (0.1) | 1.6 | — | — | — | NMP | — | 25 |
| Comp. Ex. 2 | S-BPPA (0.1) | 4,4'-DDE (0.1) | 1.4 | — | — | — | DMAC | — | 23 |
| Comp. Ex. 3 | S-BPDA (0.1) | p-PDA (0.1) | 1.9 | — | — | — | DMAC | — | 26 |

Note.
The component symbols in Table 1 respectively stand for the following compounds.
S-BPDA: 3,4,3',4'-biphenyltetracarboxylic dianhydride.
PMDA: pyromellitic dianhydride.
BTDA: 3,4,3',4',-benzophenonetetracarboxylic dianhydride.
p-PDA: p-phenylendiamine.
m-PDA: m-phenylenediamine.
4,4'-DDE: 4,4'-diaminodiphenyl ether.
APMS-6: $H_2N-(CH_2)_3Si(CH_3)_2+O-Si(CH_3)_2\frac{1}{4}OSi(CH_3)_2-(CH_2)_3NH_2$.
APMS-18: $H_2N-(CH_2)_3Si(CH_3)_2+O-Si(CH_3)_2\frac{1}{16}OSi(CH_3)_2-(CH_2)_3NH_2$.

p-APS: 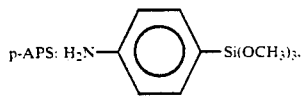

APSE: $H_2N-(CH_2)_3-Si(OCH_2CH_3)_3$.
DMAC: dimethylacetamide.
NMP: N-methyl-2-pyrrolidone.

TABLE 2

| | Conditions of Contact Bonding | | | Results | |
|---|---|---|---|---|---|
| Ex. No. Comp. Ex. No. | Temp. °C | Linear Pressure kg/cm | Speed m/min | Peel Strength (180°) kg/cm | Curl Diameter cm |
| Ex. 1 | 380 | 40 | 0.2 | 1.4 | ∞ |
| Ex. 2 | 410 | 40 | 0.2 | 1.4 | ∞ |
| Ex. 3 | 440 | 40 | 0.2 | 1.4 | ∞ |
| Ex. 4 | 380 | 20 | 0.1 | 1.3 | ∞ |
| Ex. 5 | 380 | 40 | 0.1 | 1.4 | ∞ |
| Ex. 6 | 380 | 40 | 0.2 | 1.7 | ∞ |
| Ex. 7 | 350 | 40 | 0.2 | 1.7 | ∞ |
| Ex. 8 | 380 | 20 | 0.2 | 1.7 | ∞ |
| Comp. Ex. 1 | 440 | 40 | 0.2 | 0.3 | 2.5 |
| Comp. Ex. 2 | 380 | 40 | 0.2 | 1.4 | 2.1 |
| Comp. Ex. 3 | 440 | 40 | 0.2 | not bonded | — |

In Table 2, the curl diameter, which is a measure of curling when a copper foil on one side of a double-sided copper-clad base board is removed by etching, is the diameter of curvature of the base board from which the copper foil has been removed.

As is apparent from the results in the foregoing examples and comparative examples, the double-sided copper-clad base boards of all examples exhibited excellent physical properties, while the double-sided copper-clad base boards of Comparative Examples 1 and 3 were poor in adhesion between the resin and the copper foils and the double-sided copper-clad base board of Comparative Example 2 was poor in resistance to curling.

What is claimed is:

1. A flexible printed-circuit base board comprising two copper foils and a resin layer of a composite material essentially composed of a polyimide having recurring units represented by the following general formula (I) and a polyimide-silicone represented by the following general formula (II), wherein said resin layer is formed directly between said two copper foils:

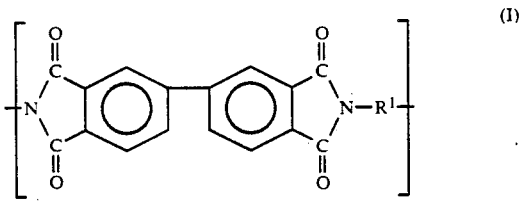

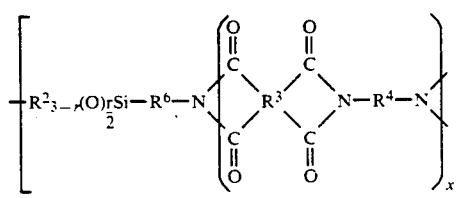

-continued

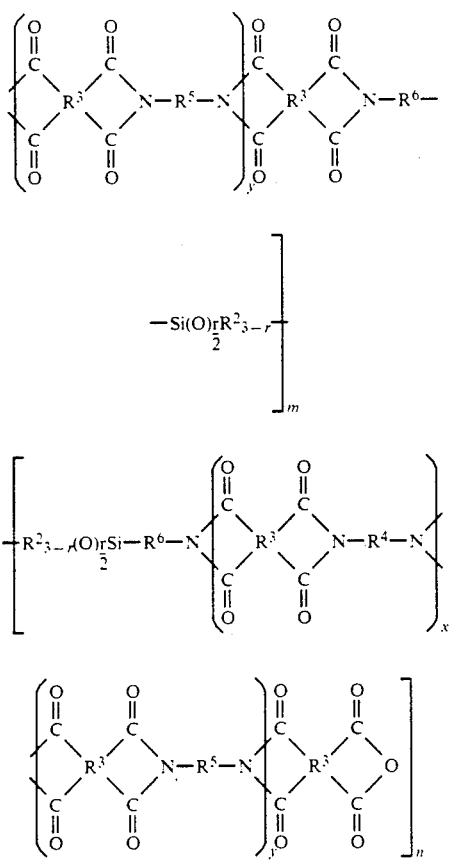

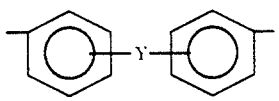

wherein $R^1$ stands for a bivalent aromatic hydrocarbon group represented by the formula:

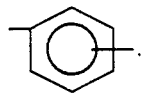

or provided that both kinds of aromatic hydrocarbon groups of the above-mentioned formulae are contained in the polyimide with units of the formula (I); $R^2$ stands for a monovalent aliphatic hydrocarbon group having at most 5 carbon atoms or a monovalent aromatic hydrocarbon group having at most 9 carbon atoms; $R^3$ stands for a tetravalent aromatic hydrocarbon group; $R^4$ stands for a bivalent aromatic hydrocarbon group; $R^5$ stands for a siloxane chain; $R^6$ stands for a bivalent aliphatic hydrocarbon group having 3 to 5 carbon atoms or a bivalent aromatic hydrocarbon group having 6 to 9 carbon atoms; Y stands for —O—, —CO—, —SO$_2$—, or —CH$_2$—; r is 2 or 3; the molar ratio of x:y is in the range of 97–60:3–40; the molar ratio of m:n is in the range of 50–100:50–0.

2. A flexible printed-circuit base board as claimed in claim 1, wherein the groups $R^1$ contained in said polyimide with units of the formula (I) are composed of 5 to 30 mol % of

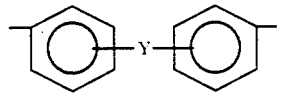

and 70 to 95 mol % of

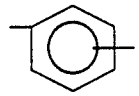

while $R^2$ in the formula (II) is a methyl group or a phenyl group and $R^5$ in the formula (II) is a siloxane chain represented by the following general formula (V):

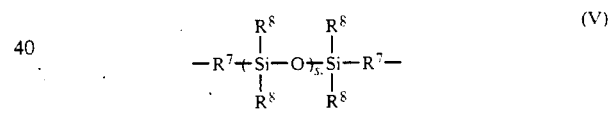

wherein $R^7$ stands for a bivalent aliphatic hydrocarbon group having 3 to 5 carbon atoms or a bivalent aromatic hydrocarbon group having 6 to 9 carbon atoms; $R^8$ stands for an aliphatic hydrocarbon group having 1 to 3 carbon atoms or an aromatic hydrocarbon group having 6 to 9 carbon atoms; Y is the same as defined in claim 1; and s stands for an integer of 3 to 150.

* * * * *